(12) United States Patent
Cao et al.

(10) Patent No.: US 7,610,950 B2
(45) Date of Patent: Nov. 3, 2009

(54) HEAT DISSIPATION DEVICE WITH HEAT PIPES

(75) Inventors: Jun Cao, Shenzhen (CN); Zhan Wu, Shenzhen (CN); Shi-Wen Zhou, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 134 days.

(21) Appl. No.: 11/557,917

(22) Filed: Nov. 8, 2006

(65) Prior Publication Data

US 2008/0105411 A1 May 8, 2008

(51) Int. Cl.
*H01L 23/427* (2006.01)
*F28D 15/02* (2006.01)

(52) U.S. Cl. ............ 165/104.33; 165/80.3; 165/104.21
(58) Field of Classification Search ................ 165/80.2, 165/80.3, 104.21, 104.26, 104.33; 361/700, 361/703
See application file for complete search history.

(56) References Cited

U.S. PATENT DOCUMENTS

| | | | |
|---|---|---|---|
| 6,189,601 B1 * | 2/2001 | Goodman et al. | 165/80.3 |
| 6,945,319 B1 * | 9/2005 | Li et al. | 165/104.33 |
| 7,100,681 B1 * | 9/2006 | Wu et al. | 165/104.33 |
| 2003/0019610 A1 * | 1/2003 | Liu | 165/80.3 |
| 2004/0035558 A1 * | 2/2004 | Todd et al. | 165/104.26 |
| 2005/0141198 A1 * | 6/2005 | Lee et al. | 361/700 |
| 2005/0257532 A1 * | 11/2005 | Ikeda et al. | 62/3.7 |
| 2007/0000646 A1 * | 1/2007 | Chen et al. | 165/104.33 |
| 2007/0074857 A1 * | 4/2007 | Xia et al. | 165/104.33 |
| 2007/0144709 A1 * | 6/2007 | Lee et al. | 165/104.33 |

FOREIGN PATENT DOCUMENTS

| | | |
|---|---|---|
| CN | 03270503.4 | 8/2003 |
| CN | 200320128888.4 | 12/2003 |
| CN | 2634658 Y | 8/2004 |
| TW | 587779 A1 * | 5/2004 |
| TW | M243001 A1 * | 9/2004 |

* cited by examiner

*Primary Examiner*—Teresa J Walberg
(74) *Attorney, Agent, or Firm*—Frank R. Niranjan

(57) ABSTRACT

A heat dissipation device includes a first base plate (10), a fin group (30) arranged on the first base plate, a first heat pipe (50) attached on the first base plate and the fin group and a second heat pipe (60) attached on the first base plate and extending across the fin group. Each of the first and second heat pipes includes an absorbing section and a dissipating section. The absorbing sections of the first and second heat pipes are L-shaped and oriented in opposite directions and dissipating sections of the first and second heat pipes are oriented perpendicular to each other, whereby heat from the first base plate attached with an electronic component can take more different dissipating-paths from the first base plate to the fin group.

15 Claims, 4 Drawing Sheets

HEAT DISSIPATION DEVICE WITH HEAT PIPES

BACKGROUND OF THE INVENTION

1. Field of the Invention

The present invention relates to a heat dissipation device for removing heat from an electronic device, and more particularly to a heat dissipation device incorporating heat pipes for improving heat dissipation capacity thereof.

2. Description of Related Art

As computer technology continues to advance, electronic components such as central processing units (CPUs) of computers are being made to provide faster operational speeds and greater functional capabilities. When a CPU operates at high speed in a computer enclosure, its temperature can increase greatly. It is desirable to dissipate the heat quickly, for example by using a heat dissipation device attached to the CPU in the enclosure. This allows the CPU and other electronic components in the enclosure to function within their normal operating temperature ranges, thereby assuring the quality of data management, storage and transfer.

A conventional heat dissipation device comprises a heat sink and a heat pipe. The heat sink comprises a base and a plurality of fins extending from the base. The base defines a groove in a top surface thereof, and a bottom surface of the base is attached to an electronic component. Each heat pipe has an evaporating portion accommodated in the groove and a condensing portion inserted in the fins. The base absorbs heat produced by the electronic component and transfers the heat directly to the fins through the heat pipe. By the provision of the heat pipe, heat dissipation efficiency of the heat dissipation device is improved.

As the CPU and other electronic components generate more heat, the heat removal capability of the conventional heat dissipation device is frequently not sufficient and heat of the base is not evenly distributed. Usually, more heat pipes can be added to improve the heat removal capability of the conventional heat dissipation device and thus solve this problem.

However, the addition of more heat pipes leads to an increase in cost of the whole heat dissipation device. Furthermore, it is both complex and cumbersome to attach more than two heat pipes to a heat sink. Therefore, it is desirable to provide a heat dissipation device that eliminates the aforementioned problems.

SUMMARY OF THE INVENTION

A heat dissipation device in accordance with a preferred embodiment of the present invention includes a first base plate, a fin group arranged on the first base plate, a first heat pipe attached on the first base plate and disposed at a side of the fin group and a second heat pipe attached on the first base plate and extending across the fin group. Each of the first and second heat pipes includes an absorbing section and a dissipating section. The absorbing sections of the first and second heat pipes are oriented in opposite directions and dissipating sections of the first and second heat pipes are perpendicular to each other, whereby heat from the first base plate attached to an electronic component can take more different dissipating-path from the first base plate to the fin group. The absorbing sections of the first and second heat pipes each are bent into an L-shaped configuration and thermally connect with the first base plate.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
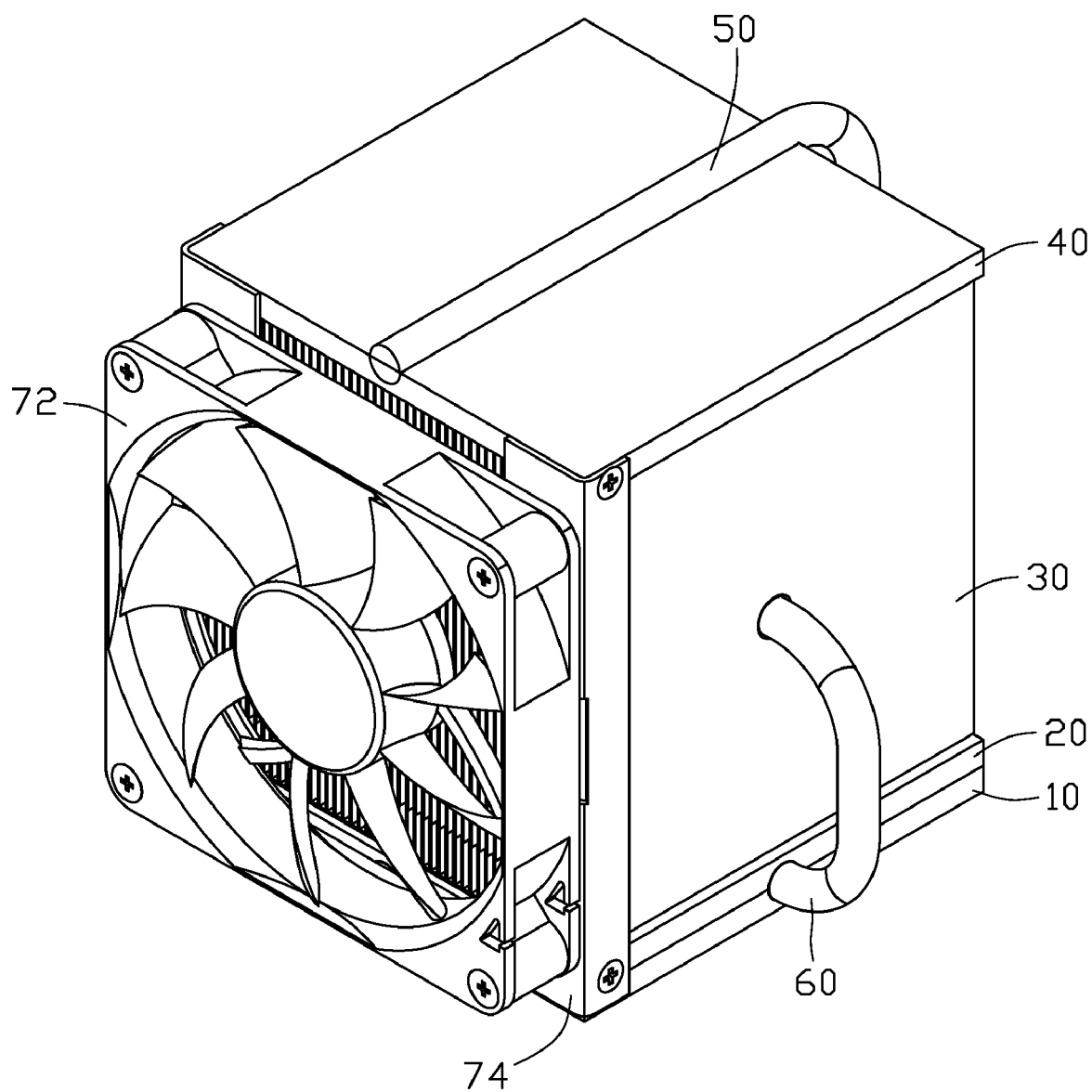
FIG. 1 is an assembled view of a heat dissipation device in accordance with a preferred embodiment of the present invention.

Referring to FIG. 1, a heat dissipation device with heat pipes in accordance with a preferred embodiment of the present invention, which is used for dissipating heat from an electronic component (not shown), such as an integrated circuit package (not shown) is illustrated. The heat dissipation device comprises a base assembly (not labeled), a cover plate 40 spaced from the base assembly, a fin group 30 extending between the base assembly and the cover plate 40, a first heat pipe 50 connecting the base assembly and the cover plate 40, a second heat pipe 60 connecting the base assembly and the fin group 30, and a fan assembly 70 arranged at a front side of the fin group 30. The base assembly comprises a first base plate 10 with a smooth bottom contacting the electronic component (not shown) and a second base plate 20 similar to the first base plate 1 0 and covering a top of the first base plate 10.

Figure 2:
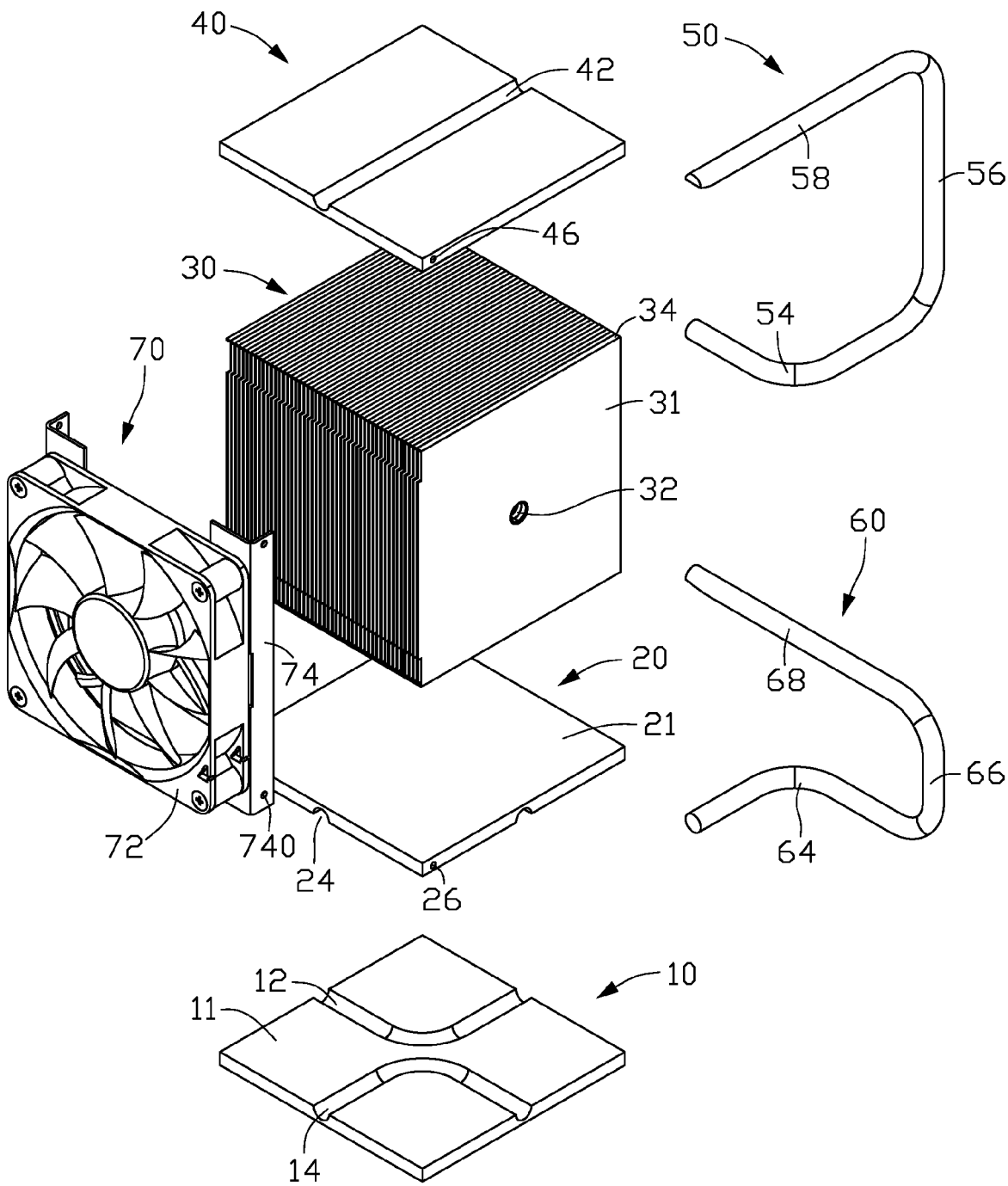
FIG. 2 is an exploded view of FIG. 1.
Figure 3:
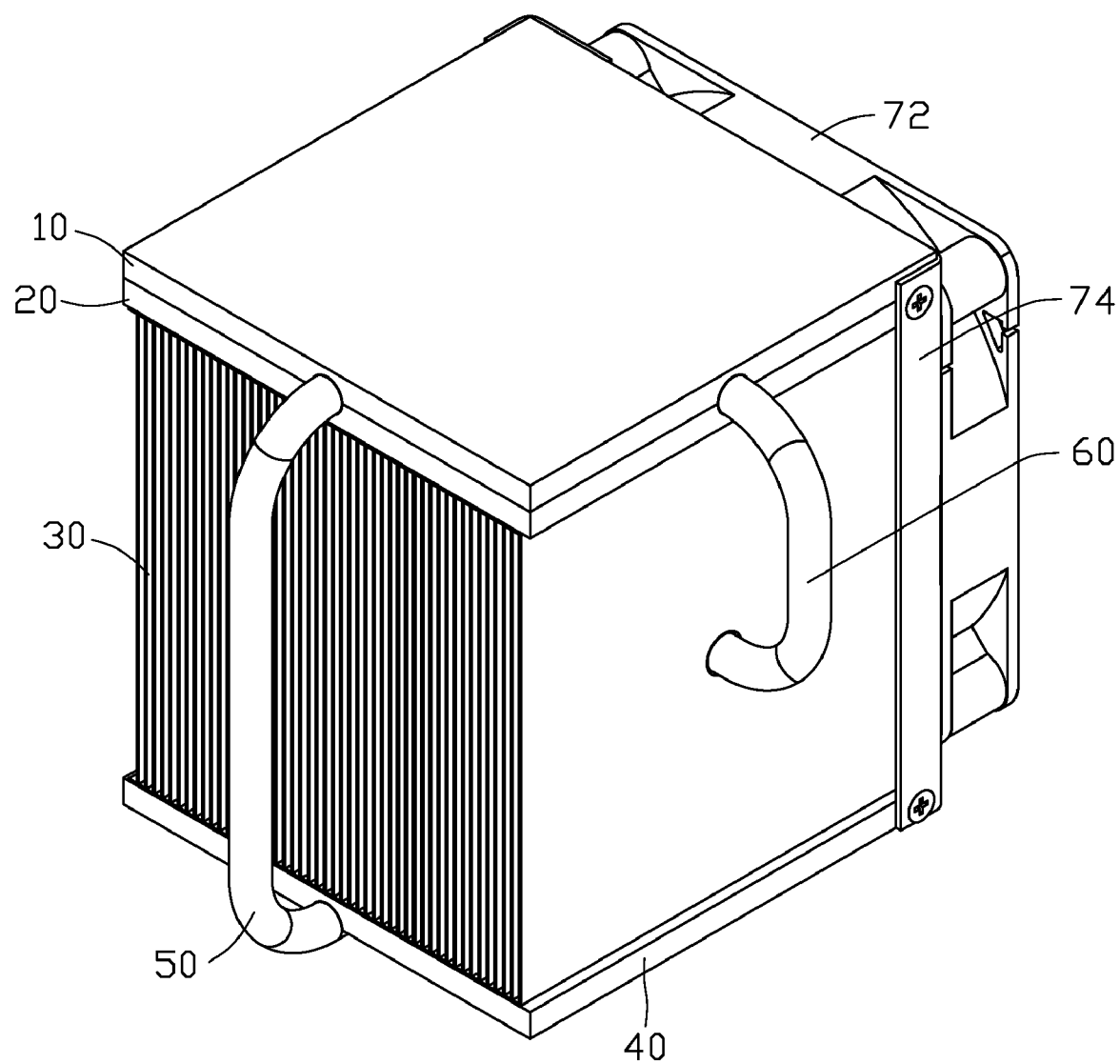
FIG. 3 is an inverted view of FIG. 1.
Figure 4:
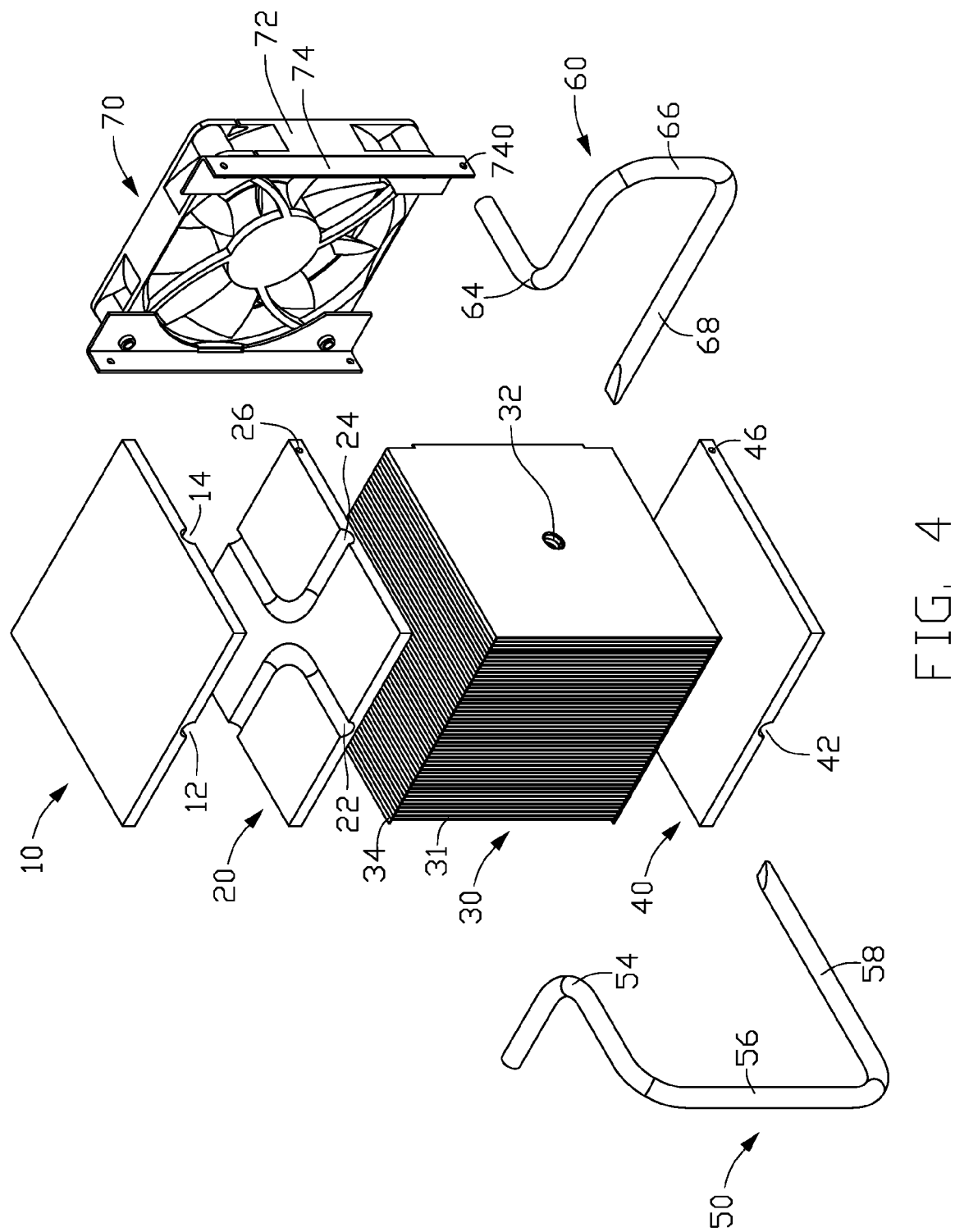
FIG. 4 is an exploded view of FIG. 3.

Referring to FIGS. 2-4, the first base plate 10 is substantially square, and made of a thermally conductive material such as copper or aluminum. The first base plate 10 can have a flat bottom surface (not labeled) for contacting the electronic component and a flat top surface 11 positioned opposite the flat bottom surface. A pair of V-shaped first grooves 1 2, 14 are defined in the flat top surface 11 of the first base plate 10. The first grooves 12, 14 are symmetrically distributed in the flat top surface 11 along diagonal corners of the first base plate 10 and cooperatively form an X-shaped pattern in the flat top surface 11 of the first base plate 10. The second base plate 20 has a flat top surface 21 attached to a bottom of the fin group 30 and also defines a pair of V-shaped second grooves 22, 24 corresponding the first grooves 12, 14, whereby the first grooves 12, 14 cooperate with the second grooves 22, 24 to cooperatively form a pair of passages for partly accommodating the first and second heat pipes 50, 60. A pair of screw holes 26 are defined in a pair of opposite sides of the second base plate 20, respectively.

The fin group 30 comprises a plurality of parallel spaced fins 31 sandwiched between the base assembly and the cover plate 40 and a plurality of channels (not labeled) each extending between two adjacent fins 31 and from a front end to a rear end of the fin group 30. Each fin 31 forms a pair of flanges 34 at upper and lower sides of the fin 31 and defines a through hole 32 in a center thereof. All the flanges 34 at the upper and lower sides of the fin 31 respectively form top and bottom planes (not labeled) on top and bottom of the fin group 30.

The cover plate 40 is substantially foursquare, and made of thermal conductive material such as copper or aluminum. The cover plate 40 defines a slot 42 in a top surface thereof for partly accommodating the first heat pipe 50 and a pair of screw holes 46 in a pair of opposite sides thereof, respectively.

Each of the first and second heat pipes 50, 60 is formed by means of curving a lower one of two parallel arms of a U-shaped heat pipe. The first heat pipe 50 comprises a first absorbing section 54 with an L-shaped configuration, a first transferring section 56 perpendicularly and upwardly extending from an end of the first absorbing section 54 and a first dissipating section 58 perpendicularly and horizontally extending from the first transferring section 56. A free end of the first absorbing section 54 is perpendicular to the first transferring section 56 and the first dissipating section 58. The first dissipating section 58 is located above and parallel to a plane defined by the first absorbing section 54. The first absorbing section 54 of the first heat pipe 50 is fixed in a corresponding passage of the base assembly consisting of the first groove 14 and the second groove 24 by soldering. The first dissipating section 58 of the first heat pipe 50 is fixed in the slot 42 of the cover plate 40 by soldering. The first transferring section 56 of the first heat pipe 50 is located on a rear side of the fin group 30 opposite to the fan assembly 70.

The second heat pipe 60 has a configuration similar to the first heat pipe 50 and comprises a second absorbing section 64 with an L-shaped configuration, a second transferring section 66 perpendicularly and upwardly extending from an end of the second absorbing section 64 and a second dissipating section 68 perpendicularly and horizontally extending from the second transferring section 66. A free end of the second absorbing section 64 is oriented perpendicular to the second transferring section 66 and the second dissipating section 68. The second dissipating section 68 is located above and oriented parallel to a plane defined by the second absorbing section 64. The second absorbing section 64 is accommodated in a corresponding passage defined in the base assembly and consisting of the first groove 12 and the second groove 22 by soldering. The second dissipating section 68 of the second heat pipe 60 extends into the through hole 32 of the fin group 30. The second transferring section 66 of the second heat pipe 60 is positioned on a middle of a lower half of a lateral side of the fin group 30. The second transferring section 66 of the second heat pipe 60 is shorter than the first transferring section 56 of the first heat pipe 50. The first and second transferring portions 56, 66 of the first and second heat pipes 50, 60 are disposed at adjacent sides of the fin group 30. The second dissipating section 68 of the second heat pipe 60 is perpendicular to the first dissipating section 58 of the first heat pipe 50.

The fan assembly 70 comprises a fan 72 and a fan holder 74 for securing the fan 72 at the front side of the fin group 30. The fan holder 74 defines four holes 740 at four corners thereof, corresponding to the screw holes 26, 46 of the second base plate 20 and the cover plate 40. Screws (not labeled) are used to extend through the holes 740 and screwed into the screw holes 26, 46, thus attaching the fan assembly 70 to the front side of the fin group 30. Airflow generated by the fan 72 flows through the channels (not labeled) in the fin group 30 to take heat away therefrom. In the present invention, the second base plate 20 is soldered to the bottom plane (not labeled) of the fin group 30 and the cover plate 40 is soldered to the top plane (not labeled) of the fin group 30. The first and second absorbing sections 54, 64 of the first and second heat pipes 50, 60 are soldered in the passages in the base assembly so that the first and second absorbing sections 54, 64 are thermally connected with the first and second base plates 10, 20. The first and second dissipating sections 58, 68 of the first and second heat pipes 50, 60 are respectively soldered in the slot 42 of the cover plate 40 and the through hole 32 of the fin group 30 so that the first and second dissipating sections 58, 68 are thermally connected with the cover plate 40 and the fin group 30, respectively.

In operation, the first base plate 10 absorbs heat from the electronic component (not shown) and a major part of the heat is directly transferred to the first and second absorbing sections 54, 64 of the first and second heat pipes 50, 60. A minor part of the heat is conducted upwardly through the second base plate 20 to the fins 31 of the fin group 30. The major part of the heat received by the first absorbing section 54 of the first heat pipe 50 is transmitted to the cover plate 40 in contact with the first dissipating section 58 of the first heat pipe 50 by the first transferring section 56 of the first heat pipe 50. The majority of the heat received by the second absorbing section 64 of the second heat pipe 60 is transmitted to the fins 31 in contact with the second dissipating section 68 of the second heat pipe 60 by the second transferring section 66 of the second heat pipe 60, thus allowing the fins 31 to dissipate the heat along paths in the bottom, top and a middle portion of the fin group 30.

In the present invention, the first and second heat pipes 50, 60 are arranged spaced from each other in the fin group 30 so that the heat can take more different dissipating-paths from the first base plate 10 to the fin group 30. Accordingly, the heat can be evenly distributed in each fin 31 of the fin group 30 and more efficiently taken away by the fan assembly 70 and heat removal efficiency of the heat dissipation device is greatly improved.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
   a base plate;
   a fin group arranged on the base plate, the fin group comprising a plurality of fins extending from the base plate, the fins being aligned parallel to and spaced from each other;
   a first heat pipe comprising a first absorbing section attached on the base plate and a first dissipating section thermally connecting an upper portion of the fin group and aligned parallel to the fins; and
   a second heat pipe comprising a second absorbing section attached on the base plate and a second dissipating section extending across the fins of the fin group;
   wherein the base plate defines a pair of V-shaped first grooves along diagonal corners thereof, the V-shaped first grooves are oriented back to back and the first and second absorbing sections are received in the first grooves each of the V-shaped first grooves forming a V-shape approximately parallel to a surface of the base plate;
   wherein middle parts of the first grooves are arranged adjacent to each other and in a center of the base plate; and
   wherein the V-shaped first grooves each define an opening of the V-shape facing a corresponding corner of the base plate.

2. The heat dissipation device as claimed in claim 1, wherein the first heat pipe comprises a first transferring section connecting the first absorbing section and the first dissipating section, and wherein the first absorbing section has a free end thereof perpendicular to both of the first transferring and dissipating sections.

3. The heat dissipation device as claimed in claim 2, wherein the first absorbing section of the first heat pipe is L-shaped.

4. The heat dissipation device as claimed in claim 2 wherein the second heat pipe comprises a second transferring section connecting the second absorbing section and the second dissipating section and wherein the second transferring section is shorter than the first transferring section of the first heat pipe.

5. The heat dissipation device as claimed in claim 4, wherein the second dissipating section of the second heat pipe is perpendicular to the first dissipating section of the first heat pipe.

6. The heat dissipation device as claimed in claim 1, further comprising a cover plate attached on the fin group, the first dissipating section of the first heat pipe being soldered to the cover plate.

7. The heat dissipation device as claimed in claim 1, further comprising an additional base plate attached to the base plate, the first and second absorbing sections being sandwiched between the base plates.

8. The heat dissipation device as claimed in claim 1, further comprising a fan assembly arranged at a side of the fin group, for generating a forced airflow through the fin group.

9. A heat dissipation device adapted for cooling an electronic component, comprising:
 a base plate adapted for contacting with the electronic component, the base plate defining a pair of V-shaped first grooves along diagonal corners thereof, each of the V-shaped first grooves forming a V-shape approximately parallel to a surface of the base plate, the V-shaped first grooves having openings oriented opposite to each other and the openings of the V-shape each facing a corresponding corner of the base plate;
 a fin group soldered to the base plate;
 a first heat pipe having an evaporating portion soldered to the base plate and a condensing portion; and
 a second heat pipe having an evaporating portion soldered to the base plate and a condensing portion extending across the fin group, the condensing portion of the second heat pipe being located between the evaporating and condensing portions of the first heat pipe;
 wherein the evaporating portions of the first and second heat pipes are oriented back to back and received in the V-shaped first grooves of the base plate, and the condensing portions of the first and second heat pipes are oriented in directions perpendicular to each other.

10. The heat dissipation device as claimed in claim 9, further comprising a cover plate attached to a top surface of the fin group, the condensing portion of the first heat pipe being soldered to the cover plate.

11. The heat dissipation device as claimed in claim 9, wherein the evaporating portion of the first heat pipe is L-shaped and the condensing portion of the first heat pipe is parallel to a plane defined by the evaporating portion of the first heat pipe.

12. The heat dissipation device as claimed in claim 9, wherein the first and second heat pipes each comprise a transferring portion between the evaporating and condensing portions thereof, the transferring portions of the first and second heat pipes are disposed at adjacent sides of the fin group.

13. A heat dissipation device for dissipating heat generated by an electronic component, comprising:
 a base plate having a bottom surface for contacting with the electronic component and a top surface opposite the bottom surface, the top surface defining two V-shaped grooves therein along diagonal corners of the base plate, the two V-shaped grooves being oriented back to back, each of the V-shaped grooves forming a V-shape approximately parallel to the top surface or the bottom surface of the base plate;
 a fin group mounted on the base plate and thermally connecting therewith;
 two heat pipes each having a heat absorbing section, a heat dissipating section and a heat transferring section interconnecting the heat absorbing section and the heat dissipating section;
 wherein the heat absorbing sections of the two heat pipes are accommodated in the grooves, respectively, and thermally connect with the base plate and the fin group, one of the heat dissipating sections is located adjacent to a top of the fin group and thermally connects therewith, the other of the heat dissipating sections extends below the one of the heat dissipating sections and thermally connects with the fin group, the two heat dissipating sections being oriented perpendicular to each other; and
 wherein the V-shaped grooves each define an opening of the V-shape facing a corresponding corner of the base plate.

14. The heat dissipation device as claimed in claim 13, wherein the heat transferring sections of the two heat pipes are located adjacent to two neighboring side faces of the fin group, respectively.

15. The heat dissipation device as claimed in claim 13, wherein the two V-shaped grooves each have an arc-shaped middle part close to each other and located in a center of the base plate.

\* \* \* \* \*